(12) United States Patent
Phan et al.

(10) Patent No.: US 11,410,891 B2
(45) Date of Patent: Aug. 9, 2022

(54) ANOMALY DETECTION AND REMEDIAL RECOMMENDATION

(71) Applicant: International Business Machines Corporation, Armonk, NY (US)

(72) Inventors: Dzung Phan, Ossining, NY (US); Robert Baseman, Brewster, NY (US); Nam H. Nguyen, Pleasantville, NY (US); Fateh Tipu, Wappingers Falls, NY (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 16/550,812

(22) Filed: Aug. 26, 2019

(65) Prior Publication Data

US 2021/0066141 A1 Mar. 4, 2021

(51) Int. Cl.
*H01L 21/66* (2006.01)
*G06N 20/00* (2019.01)
*G06N 7/00* (2006.01)
*G01R 31/26* (2020.01)

(52) U.S. Cl.
CPC .......... *H01L 22/14* (2013.01); *G01R 31/2601* (2013.01); *G06N 7/005* (2013.01); *G06N 20/00* (2019.01)

(58) Field of Classification Search
CPC ..... H01L 22/14; H01L 2222/14; G06N 20/00; G06N 7/005; G01R 31/2601
See application file for complete search history.

(56) References Cited

U.S. PATENT DOCUMENTS

| 8,645,304 | B2 | 2/2014 | Jiang et al. |
| 9,754,891 | B2 | 9/2017 | Briggs et al. |
| 10,430,719 | B2 * | 10/2019 | David .................... H01L 22/14 |
| 11,275,975 | B2 * | 3/2022 | Cantwell ............... G06V 10/82 |
| 2016/0285700 | A1 | 9/2016 | Gopalakrishnan et al. |
| 2018/0275642 | A1 | 9/2018 | Tajima et al. |
| 2019/0088540 | A1 | 3/2019 | Hou et al. |

(Continued)

FOREIGN PATENT DOCUMENTS

JP 2004186445 A 7/2004

OTHER PUBLICATIONS

Karim et al., "LSTM Fully Convolutional Networks for Time Series Classification," IEEE Access, vol. 6, pp. 1662-1669 (Feb. 2018).

(Continued)

*Primary Examiner* — Bryan Bui
(74) *Attorney, Agent, or Firm* — Joseph Petrokaitis; Michael J. Chang, LLC

(57) ABSTRACT

Anomaly detection and remedial recommendation techniques for improving the quality and yield of microelectronic products are provided. In one aspect, a method for quality and yield improvement via anomaly detection includes: collecting time series sensor data during individual steps of a semiconductor manufacturing process; calculating anomaly scores for each of the individual steps using a predictive model; and implementing changes to the semiconductor manufacturing process based on the anomaly scores. A system for quality and yield improvement via anomaly detection is also provided.

15 Claims, 9 Drawing Sheets

(56) References Cited

U.S. PATENT DOCUMENTS

2020/0333777 A1* 10/2020 Maruyama ......... G05B 23/0254
2020/0379454 A1* 12/2020 Trinh ................... G06N 3/0454

OTHER PUBLICATIONS

D. Phan et al., "A Novel I0-constrained Gaussian Graphical Model for Anomaly Localization," Proceedings of the 17th International Conference on Data Mining Workshops (ICDMW 2017), Nov. 2017, pp. 830-833 (4 pages).

T. Ide et al., "Multi-task Multi-modal Models for Collective Anomaly Detection," Proceedings of the 2017 IEEE International Conference on Data Mining (ICDM 17), New Orleans, LA, Nov. 2017, pp. 177-186 (10 pages).

P. Remy, "Anomaly Detection in Time Series using Auto Encoders," Oct. 2, 2016 [Accessed Mar. 27, 2019] (10 pages).

K. Lee et al., "A Convolutional Neural Network for Fault Classification and Diagnosis in Semiconductor Manufacturing Processes," in IEEE Transactions on Semiconductor Manufacturing, vol. 30, No. 2, pp. 135-142, May 2017.

M. Al Iqbal et al., "Automated Diagnosis of Anomalies via Sensor-Step Data Outlier Detection: An Application in Semiconductors" ACM ISBN 978-1-4503-2138-9 [Accessed Mar. 27, 2019] (9 pages).

English Translation of JP2004186445A by Ogawa Minoru et al. (Mar. 28, 2019) (43 pages).

\* cited by examiner $$K(t_1, t_2) = \sigma e^{-\left(\frac{t_1-t_2}{l}\right)^\alpha} + \eta \delta_{12}$$

Signal variance — Roughness — Time Scale — Noise Variance $$p(X) = \sum_{k=1}^{K} \pi_k \underbrace{N(X|\mu_k, \Sigma_k)}_{\text{Component}}$$
↑
Mixing coefficient $$\forall k : \pi_k \geq 0 \qquad \sum_{k=1}^{K} \pi_k = 1$$

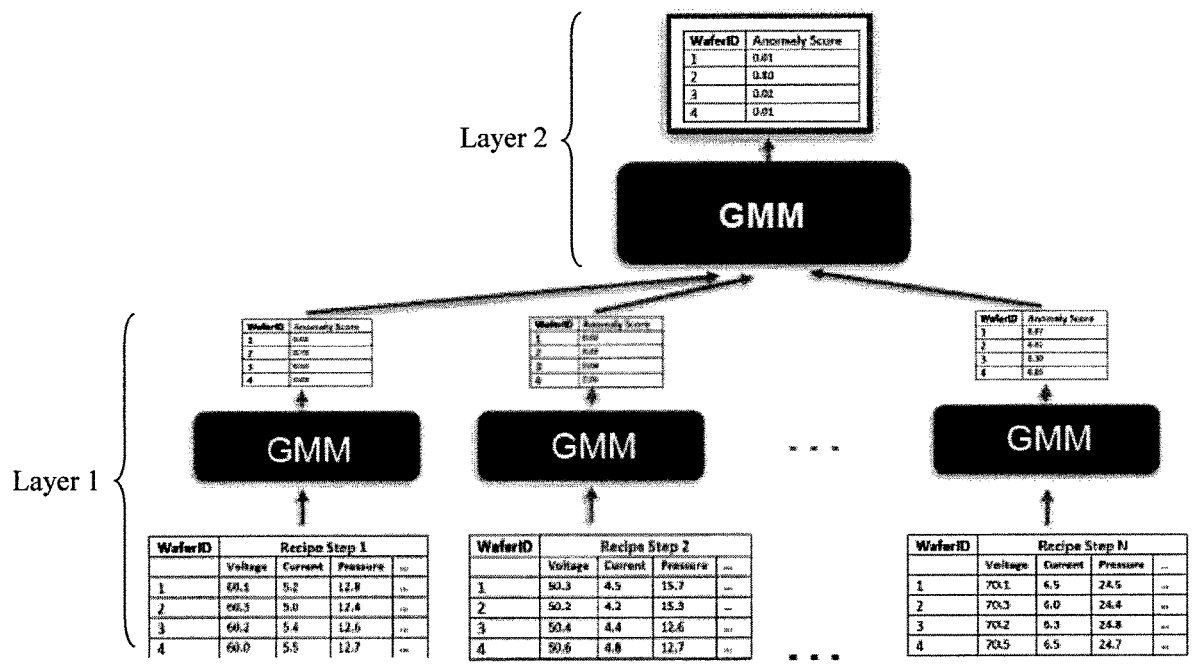
FIG. 15
FIG. 16
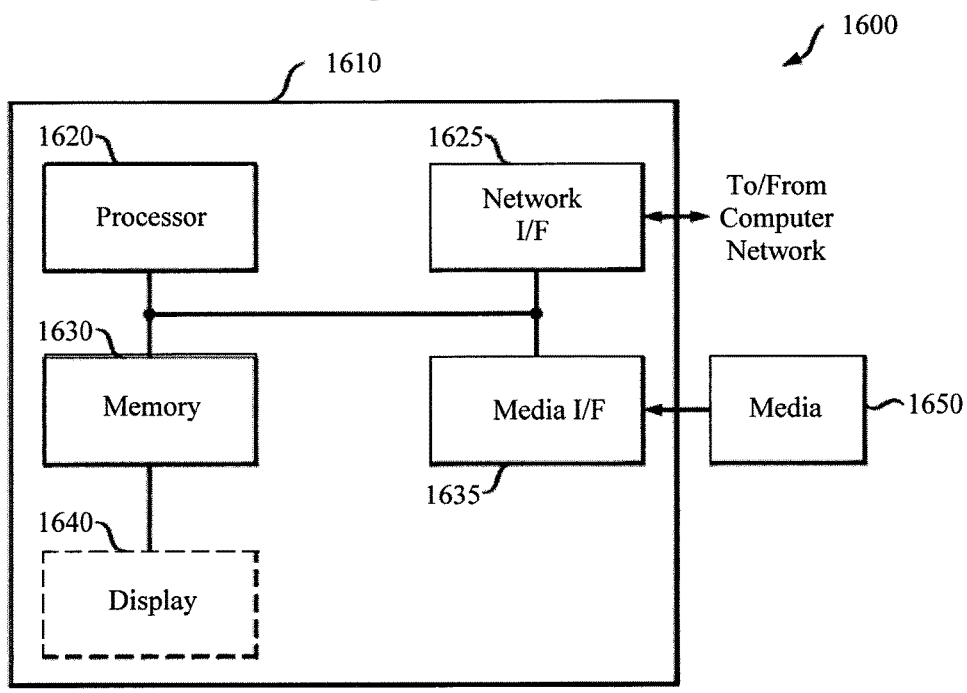

ANOMALY DETECTION AND REMEDIAL RECOMMENDATION

FIELD OF THE INVENTION

The present invention relates to microelectronic processing, and more particularly, to anomaly detection and remedial recommendation techniques for improving the quality and yield of microelectronic products.

BACKGROUND OF THE INVENTION

The overall quality and yield of microelectronic products depends on the quality and yield of individual unit processes and the successful integration of many (e.g., hundreds) of unit processes. For instance, a typical semiconductor integrated circuit fabrication process involves the coordination of many different steps performed in stages to produce end-product chips. The input to each stage involves a variety of often variable components (e.g., incoming wafer variability, masking level variability, etc.), each of which can introduce anomalies that affect the viability of the end-product chips, i.e., whether the end-product chips are within specifications, or need to be re-worked or scrapped.

Investing time, energy and resources into chips that ultimately need to be re-worked or discarded is inefficient, costly, and undesirably decreases the overall production yield. Thus, being able to detect these anomalies, and recommend/take corrective action early in the fabrication process can vastly improve the overall quality and yield. However, as provided above, a typical semiconductor fabrication process involves a multitude of unit processes that factor into the viability of the end-product device.

Therefore, techniques for improving the quality and yield of a semiconductor fabrication process at the granularity of individual unit processes or small aggregations thereof would be desirable.

SUMMARY OF THE INVENTION

The present invention provides anomaly detection and remedial recommendation techniques for improving the quality and yield of microelectronic products. In one aspect of the invention, a method for quality and yield improvement via anomaly detection is provided. The method includes: collecting time series sensor data during individual steps of a semiconductor manufacturing process; calculating anomaly scores for each of the individual steps using a predictive model; and implementing changes to the semiconductor manufacturing process based on the anomaly scores.

In another aspect of the invention, a system for quality and yield improvement via anomaly detection is provided. The system includes: a sensor network for collecting time series sensor data during individual steps of a semiconductor manufacturing process; an anomaly score calculator for calculating anomaly scores for each of the individual steps using a predictive model, wherein the predictive model is a two-layer sparse Gaussian mixture model; and a process operations update module for implementing changes to the semiconductor manufacturing process based on the anomaly scores.

A more complete understanding of the present invention, as well as further features and advantages of the present invention, will be obtained by reference to the following detailed description and drawings.

BRIEF DESCRIPTION OF THE DRAWINGS

FIG. 15 is a diagram illustrating two-layer Gaussian mixture model learning according to an embodiment of the present invention; and FIG. 16 is a diagram illustrating an exemplary apparatus that can be employed in carrying out one or more of the present techniques according to an embodiment of the present invention.

DETAILED DESCRIPTION OF PREFERRED EMBODIMENTS

As highlighted above, the overall quality and yield of microelectronic products depends on the quality and yield of individual unit processes and the successful integration of a multitude of unit processes performed using a multitude of processing steps at various different fabrication stages. Provided herein are techniques for improving the quality and yield of individual unit processes or aggregations thereof to improve the overall quality and yield of the resulting microelectronic products.

As will be described in detail below, the unit process quality is inferred using metrics such as tool sensor time series measurements (which reflect tool condition and wafer recipes), incoming (i.e., partially completed) product characteristics, and other data. For instance, according to an exemplary embodiment, the present techniques employ a predictive model of semiconductor manufacturing using toolset-related data, wafer data, and auxiliary data (i.e., all other data used to build a prediction model, other than the direct measurements of the tool) for anomaly detection and remediation of anomalies in order to improve quality and yield. See below. By way of this root-cause analysis, remedial action can be identified and implemented, i.e., in particular which minimal changes on the tool bring it to a desired state.

For instance, the present techniques can be implemented in conjunction with a semiconductor fabrication process such as metallization performed using an automated fabrication tool such as the thin film metal deposition tools commercially available from Applied Materials®, Santa Clara, Calif. For instance, see U.S. Patent Application Publication Number 2019/0088540 by Hou et al., entitled "Methods and Apparatus for Filling Substrate Features with Cobalt" (hereinafter "U.S. Patent Application Publication Number 2019/0088540"), the contents of which are incorporated by reference as if fully set forth herein. U.S. Patent Application Publication Number 2019/0088540 describes having multiple processing chambers integrated into a cluster tool for metallization.

Figure 1:
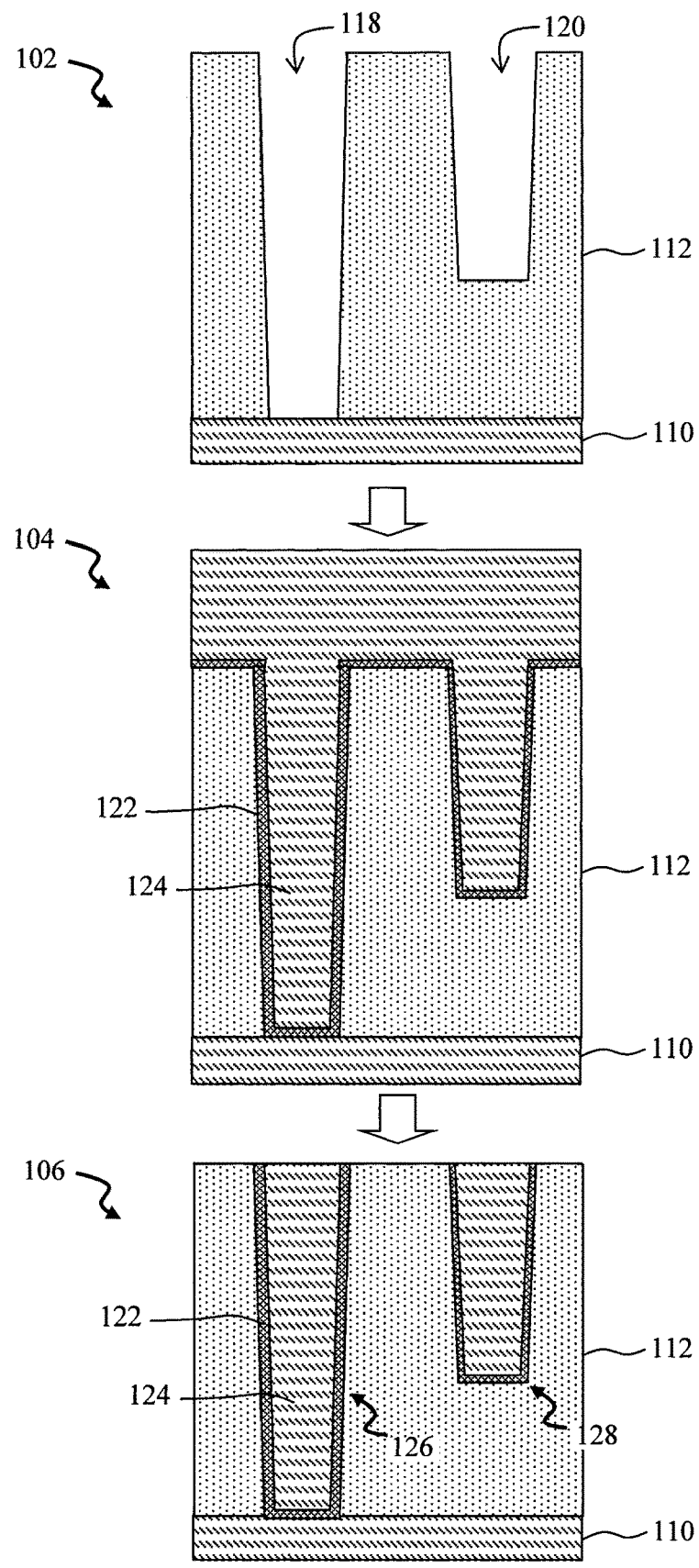
FIG. 1 is a diagram illustrating an exemplary metallization process according to an embodiment of the present invention.

Metallization typically involves the deposition of a variety of different materials for use as barrier layers, liners, seed layers, bulk conductors, etc. at select stages of the fabrication process. For instance, the formation of an interconnect in a feature such as a trench and/or via can involve first lining the feature with a barrier layer such as tantalum (Ta), tantalum nitride (TaN), cobalt (Co), ruthenium (Ru), and/or a seed layer such as copper (Cu), copper-manganese (CuMn), etc., and then depositing a bulk metal conductor such as Cu over the barrier/seed layer(s). By way of example only, see FIG. 1 which illustrates an exemplary metallization process. It is notable that FIG. 1 is merely being provided as an example to illustrate the concepts referenced herein, and that the present techniques are in no way limited to this metallization process or any other semiconductor process in particular. Namely, as highlighted above, the present techniques are broadly applicable to any semiconductor fabrication process that involves the integration of a multitude of unit processes for which the instant techniques can be implemented to improve the quality/yield thereof.

In this example, metal interconnects will be formed in a dielectric over a metal line. Namely, as shown in FIG. 1, the process begins with a metal line 110 over which a dielectric layer 112 is disposed. Suitable dielectrics include, but are not limited to, nitride-based dielectrics such as silicon nitride (SiN), silicon oxycarbonitride (SiOCN), etc. and/or oxide-based dielectrics such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

As shown in step 102, standard lithography and etching techniques are used to pattern a (first) feature 118 and a (second) feature 120 (e.g., trenches or vias) in dielectric layer 112. As shown in step 102, feature 118 extends through dielectric layer 112 down to metal line 110. On the other hand, feature 120 extends only partway through the dielectric layer 112.

As shown in step 104, metallization begins with the deposition of a conformal layer 122 into and lining the features 118 and 120 using a deposition process such as chemical vapor deposition (CVD), atomic layer deposition (ALD) or physical vapor deposition (PVD). While depicted as a single layer in the figures, layer 122 can in fact include multiple layers deposited sequentially, one on top of the other. For instance, in the case of a Cu interconnect, a barrier layer (e.g., Ta, TaN, Co and/or Ru) is first deposited into and lining the feature, followed by a Cu-containing seed layer (e.g., pure Cu or CuMn). A Cu-containing seed layer assists in the electroplating of Cu into the interconnect. See, for example, U.S. Pat. No. 9,754,891 issued to Briggs et al., entitled "Low-Temperature Diffusion Doping of Copper Interconnects Independent of Seed Layer Composition," the contents of which are incorporated by reference as if fully set forth herein.

A conductor 124 (e.g., Cu, Co and/or Ru) is then deposited into and filling the features 118 and 120 over layer 122. As highlighted above, the use of a seed layer facilitates electroplating of the conductor 124 into the features. Other techniques such as sputtering, evaporation, etc. may also be employed to deposit conductor 124.

The overburden of conductor 124 is then removed using a process such as chemical mechanical polishing (CMP). See step 106. The result is the formation of interconnects 126 and 128 in dielectric layer 112.

As highlighted above, a thin film metal deposition tool (e.g., a cluster tool having multiple processing chambers) can be used to automate this flow, whereby the workpiece is processed at different stages to sequentially deposit the corresponding material(s) at the appropriate locations. Advantageously, throughout this multi-step process the tool has sensors installed by the tool manufacturer, the user, and/or third-party vendors to collect data (such as temperature, pressure, voltage, etc.) at each step. This sensor data is leveraged by the present system to learn novel behavior and, based on that behavior, to detect when anomalies occur that affect output quality and yield.

Figure 2:
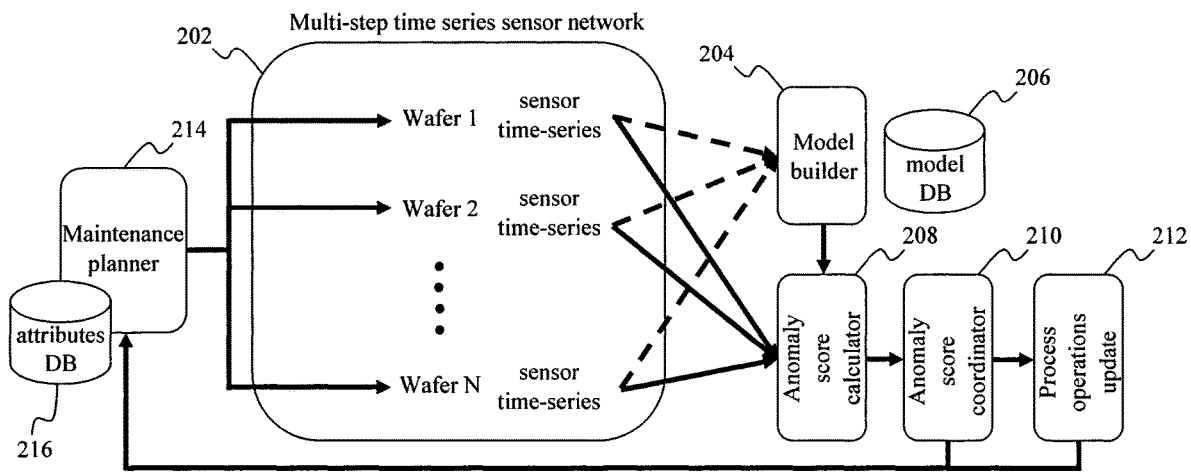
FIG. 2 is a diagram illustrating an exemplary system for quality and yield improvement via anomaly detection according to an embodiment of the present invention.

For instance, an exemplary quality/yield improvement system 200 via anomaly detection (for semiconductor manufacturing) is shown in FIG. 2. As shown in FIG. 2, system 200 employs a multi-step time series sensor network 202 where time series sensor measurements are collected from multiple wafers (i.e., Wafer 1, Wafer 2, . . . , Wafer N) reflecting, for example, the tool condition, wafer characteristics and recipes during individual steps of a multi-step semiconductor manufacturing process such as a semiconductor metallization process. While reference is made in the instant example to a multi-step process, it is to be understood that the present techniques are not tailored exclusively to quality control of a multi-step process, and can be implemented in the same manner described to the control of single step process.

A model builder 204 constructs predictive models of the semiconductor manufacturing process using the toolset and wafer-related time series sensor measurements from the sensor network 202 for anomaly detection during the individual steps. Once built, the models are stored in a model database (DB) 206. Actual wafer production data can then be fed into the models and an anomaly score calculated (via anomaly score calculator 208) for the wafers during each step. An anomaly score coordinator 210 tallies the anomaly scores for the Wafer 1, Wafer 2, ..., Wafer N over the various steps and, if changes to any of the steps are needed, updates are implemented via a process operations update module 212. For example, if the anomaly score for at least one of the steps exceeds a threshold value, then changes to manufacturing process are implemented via process operations update module 212. Process operations update module 212 recommends remedial actions (e.g., minimal changes on the tool to bring it to a desired state) and schedules updates to the various steps in accordance with the suggestions via maintenance planner 214 and attributes database (DB) 216. Attributes such as the time series sensor measurements, anomaly score and remedial action recommendations are stored in attributes DB 216.

Figure 3:
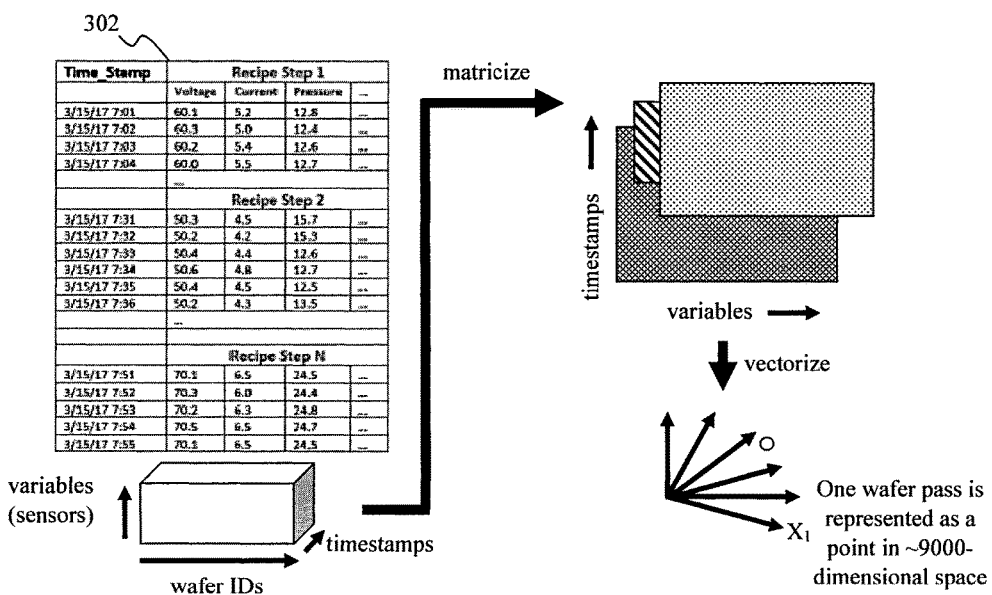
FIG. 3 is a diagram schematically illustrating multi-dimensional time series sensor data according to an embodiment of the present invention.

The prediction problem is however complicated due to high dimensionality, different span or range of time series data, temporal order of observations, noisy data, etc. See, for example, FIG. 3. As shown in FIG. 3, the sensor measurements 302 from Wafer 1, Wafer 2, ..., Wafer N at Step 1, Step 2, ..., Step N are multi-dimensional and collected over range of different time series, i.e., at Step 1, Step 2, ..., Step N, respectively. After matricization and vectorization, one wafer pass is represented as a point in high-dimensional, e.g., 10,000 dimensional, space. Thus, an approach is needed to capture the essence of the time series to reduce the dimensionality. According to the present techniques, a compressed data representation is used for each step in the multi-step (e.g., semiconductor manufacturing) process.

Figure 4:
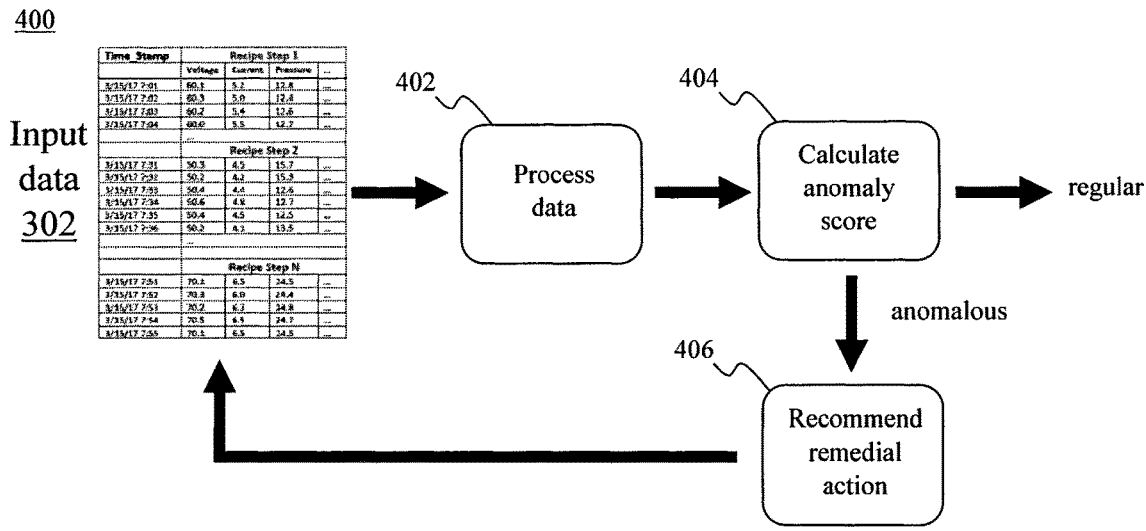
FIG. 4 is a diagram illustrating an exemplary methodology for building a predictive model for anomaly detection according to an embodiment of the present invention.

An exemplary methodology 400 for building a predictive model for anomaly detection is now described by way of reference to FIG. 4. According to an exemplary embodiment, one or more steps of methodology 400 are performed using model builder 204 and anomaly score calculator 208 described in conjunction with the description of system 200 of FIG. 2, above.

As shown in FIG. 4, the process begins with historical input data 302 for the various steps of a multi-step semiconductor manufacturing process such as metallization. As provided above, this unfiltered input data is multi-dimensional and collected over a range of different time series. For instance, historical input data 302 can include sensor data collected during the different steps of the process, and is timestamped. By way of example only, the sensor data can include, but is not limited to, voltage, current, pressure, position, flow, power, temperature, state, speed, time, duration, bias, frequency, setpoint, count, velocity, intensity, phase, cycle, in-use time, in-use cycles and/or impedance sensor data. Further, sensors can also be characterized in terms of the machine subsystems monitored. For example, sensor data collected from manufacturing tool subsystems include, but are not limited to, dopant gas, reactant gas, carrier gas, RF, vacuum, electrostatic chuck, process temperature, external environment and/or chamber condition.

A compressed data representation is then used for the historical input data 302 in each step. Namely, in step 402 the historical input data 302 is processed using simple statistics (e.g., mean, median and standard deviation for each feature), principal component analysis (PCA) for each feature, a gaussian random process (GRP) for each feature, an autoencoder for each feature and combinations thereof (see below) to produce a compressed data representation of the historical input data 302. According to an exemplary embodiment, each feature, or column in a table data file, represents a measurable piece of data that can be used for building a model, for example, voltage, current, pressure, temperature, etc. in the tool.

The processed data is then used to train a prediction model by calculating an anomaly score and, if anomalous, determining what remedial action can be used to lower the score below the threshold (see, for example, model builder 204 of system 200). For instance, in step 404 the prediction model is used to calculate an anomaly score for each step of the multi-step process using the compressed data representation of the historical input data 302 (from step 402). According to an exemplary embodiment, the prediction model is a two-layer sparse Gaussian mixture model.

If the anomaly score for a given step of the multi-step process is less than a threshold value, then the output from that step is considered regular, i.e., non-anomalous, and no remedial action is needed. On the other hand, if the anomaly score for a given step of the multi-step process is greater than or equal to the threshold value, then in step 406 remedial action is recommended to correct the anomalies.

For instance, remedial actions such as changes to at least one of the voltage, current and pressure for each step that is anomalous can be implemented in the fabrication process. Methodology 400 is then repeated to compute updated anomaly scores. By this process, the prediction model can learn the impact different remedial actions have on the output of each step. As will be described in detail below, a novel nonlinear programming model for minimal adjustments is used.

Once trained, the predictive model can be used to detect anomalies during an actual semiconductor fabrication process where data is collected from the processing of a wafer and, based on that data, the trained predictive model makes remedial action recommendations that can be implemented to improve the quality and yield of subsequent wafers. See, for instance, exemplary methodology 500 of FIG. 5 for anomaly detection and remedial action recommendation in a semiconductor manufacturing process using the (trained) predictive model.

In step 502, input data from the semiconductor manufacturing process is processed. According to an exemplary embodiment, the input data consists of time series sensor measurements made at each step of the semiconductor manufacturing process. As provided above, this unfiltered input data is multi-dimensional. For instance, the input can include timestamped voltage, current and/or pressure sensor data collected during the different steps of the semiconductor manufacturing process. According to an exemplary embodiment, in step 502 the input data is processed using simple statistics (e.g., mean, median and standard deviation for each feature), PCA for each feature, a GRP for each feature, an autoencoder for each feature and combinations thereof to produce a compressed data representation of the input data. As described in conjunction with the description of FIG. 2 above, these time series sensor measurements can be acquired from the automated fabrication tool performing the semiconductor manufacturing process and stored in an attributes database (DB) 216. See FIG. 5.

In step 504, the trained prediction model (e.g., two-layer sparse Gaussian mixture model) is used to calculate an anomaly score for each step of the multi-step process using the compressed data representation of the input data (from step 502). See, for example, anomaly score calculator 208 of system 200.

Figure 5:
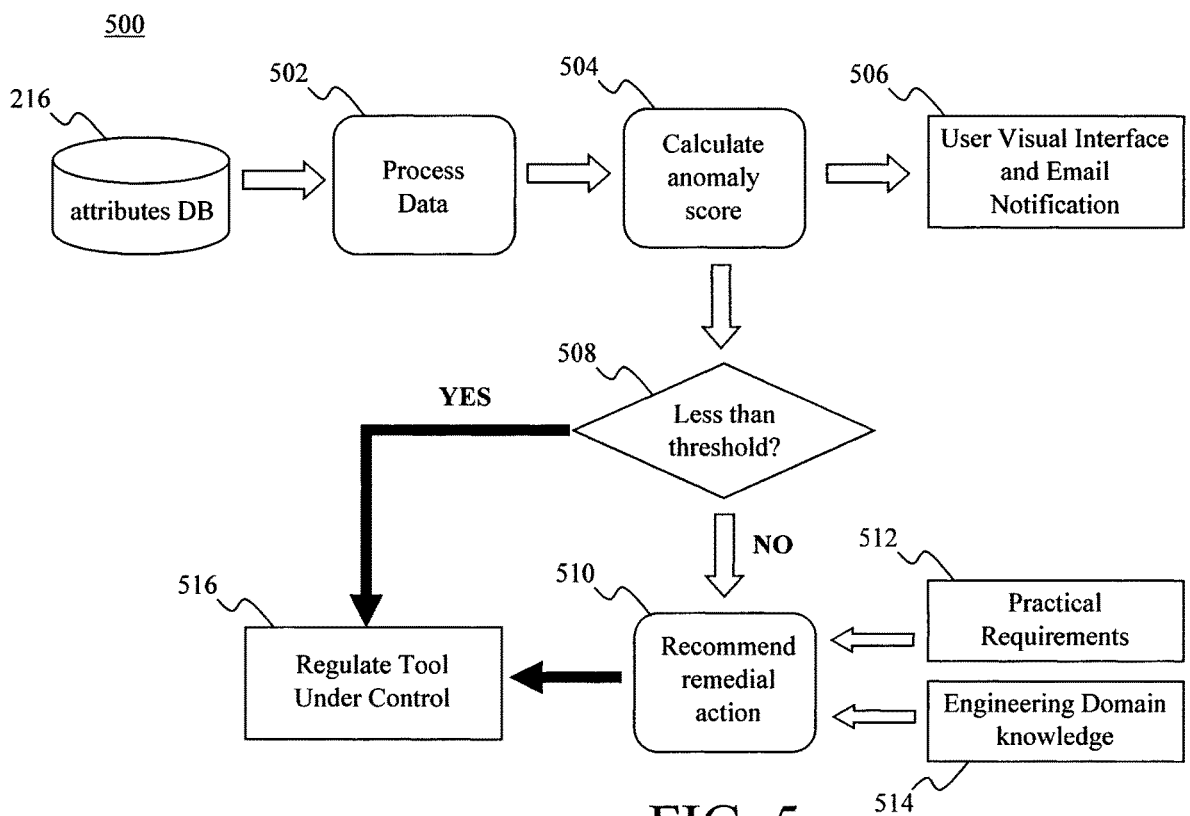
FIG. 5 is a diagram illustrating an exemplary methodology for anomaly detection and remedial action recommendation in a semiconductor manufacturing process using a predictive model according to an embodiment of the present invention.

As shown in FIG. 5, the anomaly score data can be reported to a user, e.g., so as to indicate which steps of the manufacturing process are proceeding regularly and which steps are reporting anomalies. Alerts and/or progress reports can be provided to the user in a number of ways. For instance, by way of example only, in step 506 the system can have a user visual interface (not shown) that displays data including the anomaly scores calculated using the trained predictive model. Alternatively or additionally, the system may also send an email, text, or other similar notification to the user with the data and/or an alert whenever anomalies are detected.

In step 508, a determination is made as to whether the anomaly scores calculated for a given step are less than a threshold value. If it is determined in step 508 that YES the anomaly scores calculated in a given step is less than a threshold value, then the output from that step is considered regular, i.e., non-anomalous, and no remedial action is needed. Namely, the current health condition of the tool is determined by the quality of the latest wafer output. The anomaly score is computed for the wafer. If the score is low (less than a pre-specified threshold), then it determined that the tool is healthy (see arrow leading back to tool under control). On the other hand, if the anomaly score calculated for a given step is greater than or equal to the threshold value, then in step 510 remedial action is recommended to correct the anomalies.

As shown in FIG. 5, several factors can be taken into consideration when formulating the remedial action recommendations. Namely, in step 512 practical requirements for the tool and/or process can be obtained. For instance, based on the tool specifications, it is not practical to recommend remedial actions involving, e.g., voltage, current and/or pressure, adjustments outside the range of the tool. Further, in step 514 engineering domain knowledge can be obtained and used in determining what remedial actions to recommend. For instance, engineers can recommend certain remedial actions to correct the anomalies and/or what actions are likely to have no effect or a negative effect. By way of example only, users can input such domain knowledge into the system via the user visible interface described above and/or via any other suitable user interface.

The remedial recommendations are then used to implement changes to the multi-step semiconductor manufacturing process. For instance, in step 516 the remedial actions are implemented in the tool under control to improve the quality and yield of subsequent wafers. For example, the voltage, current and/or pressure can be altered in the tool in one or more of the steps for which anomalies were detected. Advantageously, these remedial actions can be implemented in the tool under control in an automated manner whereby the voltage, current and/or pressure parameters of the tool can be automatically adjusted for each step reporting an anomaly based on the feedback from the present anomaly detection process. For instance, the tool under control can perform each step in a separate processing chamber. See, for example, U.S. Patent Application Publication Number 2019/0088540. Thus, by way of the present techniques, the voltage, current, pressure, position, flow, power, temperature, state, speed, time, duration, bias, frequency, setpoint, count, velocity, intensity, phase, cycle, in-use time, in-use cycles and/or impedance parameters of the corresponding processing chamber(s) can be automatically adjusted based on the remedial action recommendations.

As provided above, the time series sensor measurements made at each step of the semiconductor manufacturing process is multi-dimensional, and is processed using simple statistics (e.g., mean, median and standard deviation for each feature), PCA for each feature, a GRP for each feature, an autoencoder for each feature and combinations thereof to produce a compressed data representation of the input data.

Figures 6, 7:
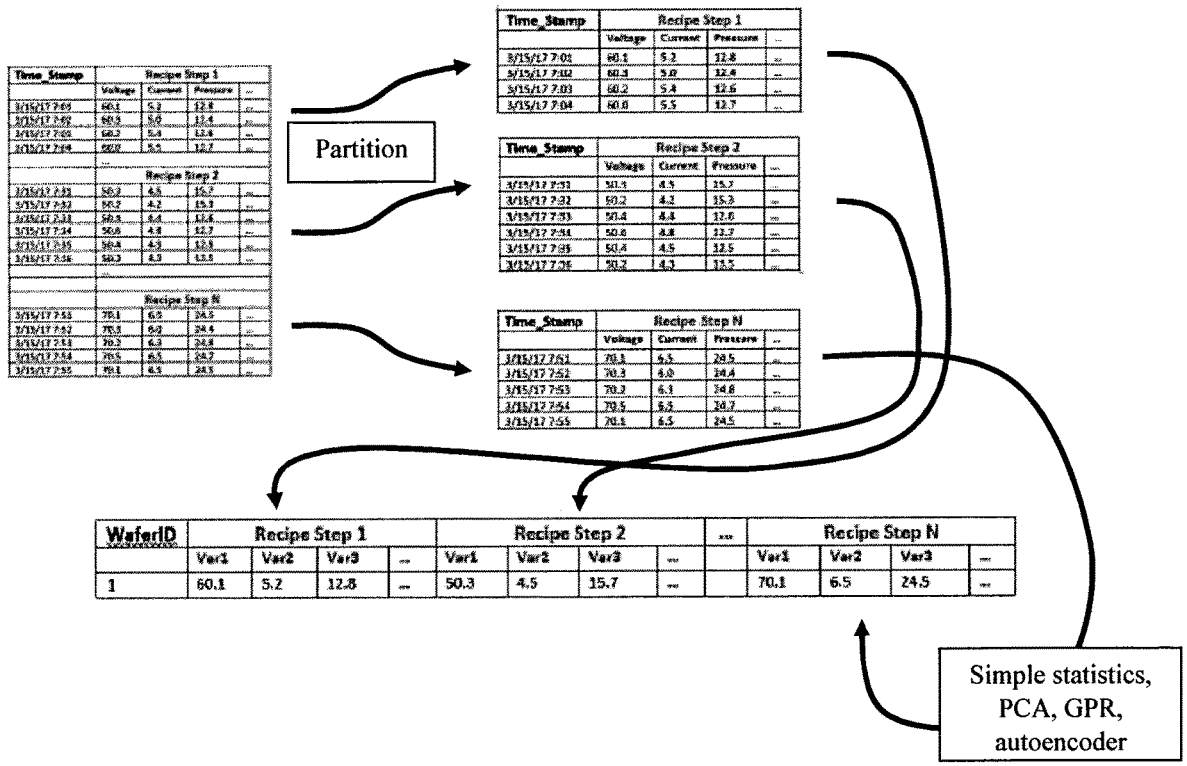
FIG. 6 is a diagram illustrating the partitioning of time series sensor data according to an embodiment of the present invention.
FIG. 7 is a diagram illustrating an exemplary kernel with 3 hyperparameters according to an embodiment of the present invention.

For instance, as shown in FIG. 6 the whole time series data may be partitioned into recipe step buckets. The terms "recipe step" or simply "step" are used synonymously throughout the description. A method for compact data representation for each recipe step will be used to get a fixed size vector. By way of example only, the time series data can be partitioned by defined recipe steps and/or by statistical features observed in the data. According to an exemplary embodiment, simple statistics are used to process the multi-dimensional input data, whereby the mean, median and standard deviations for each sensor are used to represent the time series data for each recipe step.

According to another exemplary embodiment, a Gaussian random process (GRP) is used to process the multi-dimensional input data. Namely, the time series for each feature can be represented by Gaussian random process hyperparameters. For instance, p(f) is a Gaussian process (GP) if for any finite dimensional subset $(t_1, \ldots t_n)$ in a time interval of interest, $p(f(t_1), f(t_2), \ldots f(t_n))$ is a multi-variate Gaussian distribution. GPs are characterized by mean and function $\mu(t)$ and covariance or kernel K (t,t'). For example, for 2 times $t_1$ and $t_2$:

$$p(f(t_1), f(t_2)) = N\left(\mu, \sum\right)$$

$$\mu = \begin{pmatrix} \mu(t_1) \\ \mu(t_2) \end{pmatrix},$$

$$\sum = \begin{pmatrix} K(t_1, t_1) & K(t_1, t_2) \\ K(t_2, t_1) & K(t_2, t_1) \end{pmatrix}.$$

Figure 8:
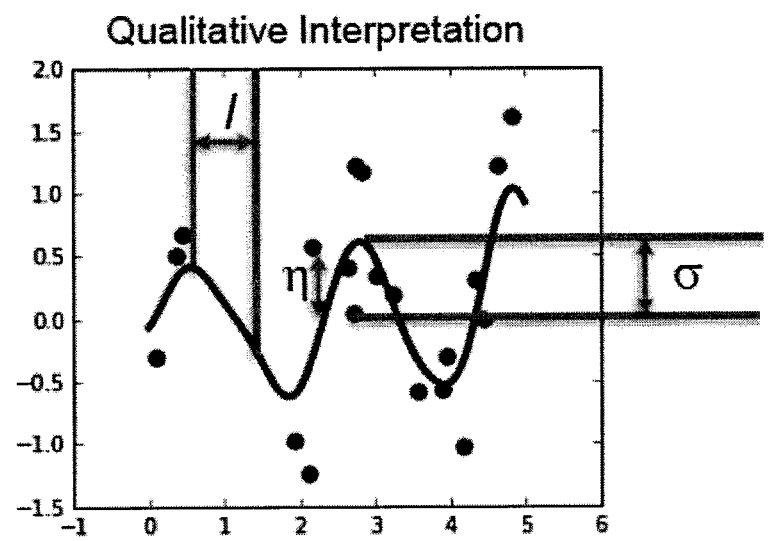
FIG. 8 is a diagram illustrating a qualitative interpretation of the hyperparameters according to an embodiment of the present invention.

For instance, an example kernel with 3 hyperparameters, i.e., time scale l, noise variance η and signal variance σ, is shown in FIG. 7. A qualitative interpretation of these 3 hyperparameters is shown in FIG. 8.

In yet another exemplary embodiment, a Long Short-Term Memory (LSTM) autoencoder is used to process the multi-dimensional input data. As is known in the art, an autoencoder is a type of artificial neural network that is used to learn data codings in an unsupervised manner. An LSTM autoencoder is a particular type of autoencoder for sequence data using an Encoder-Decoder LSTM architecture.

Figure 9:
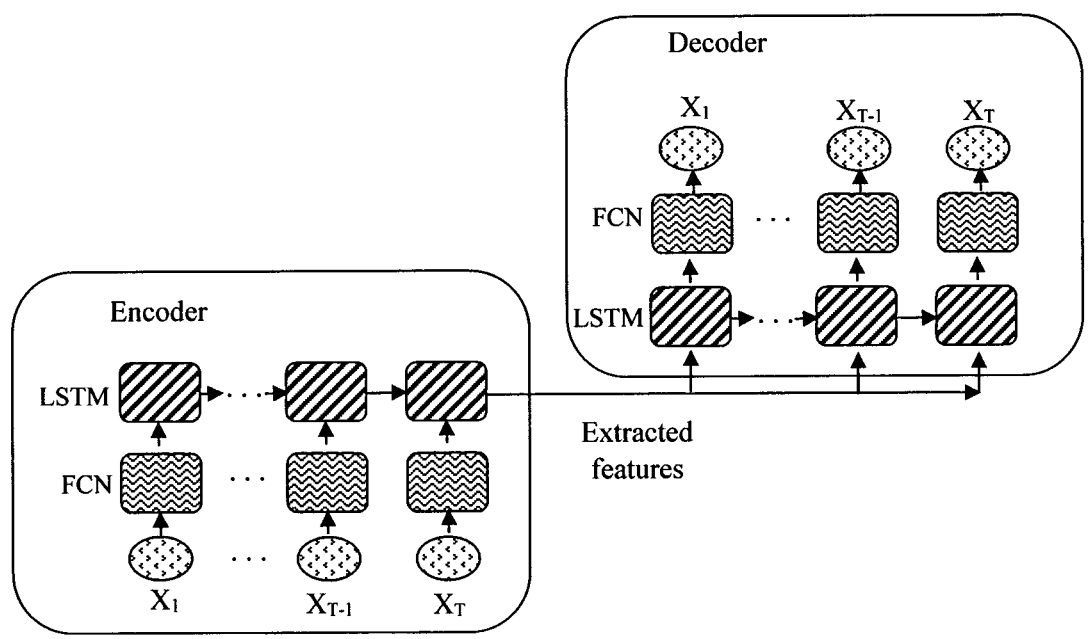
FIG. 9 is a diagram illustrating a Long Short-Term Memory (LSTM) autoencoder process according to an embodiment of the present invention.

As shown in FIG. 9, this approach involves learning a vector of feature representation from the trace data (e.g., the sensor data and the control setpoint data) for the time series data from each recipe step. Namely, as shown in FIG. 9, the input to the encoder and the output from the decoder is the trace data, i.e., $X_1 \ldots X_{T-1}, X_T$. In this example, an LSTM fully connected network (FCN) is used for time series classification. For a general description of the use of FCNs for classifying time series sequences see, for example, Karim et al., "LSTM Fully Convolutional Networks for Time Series Classification," IEEE Access, vol. 6, pps. 1662-1669 (February 2018), the contents of which are incorporated by reference as if fully set forth herein. The output of the encoder is the feature vector, which will be used as the input to the prediction model. The prediction model is the fully connected network.

Figure 10:
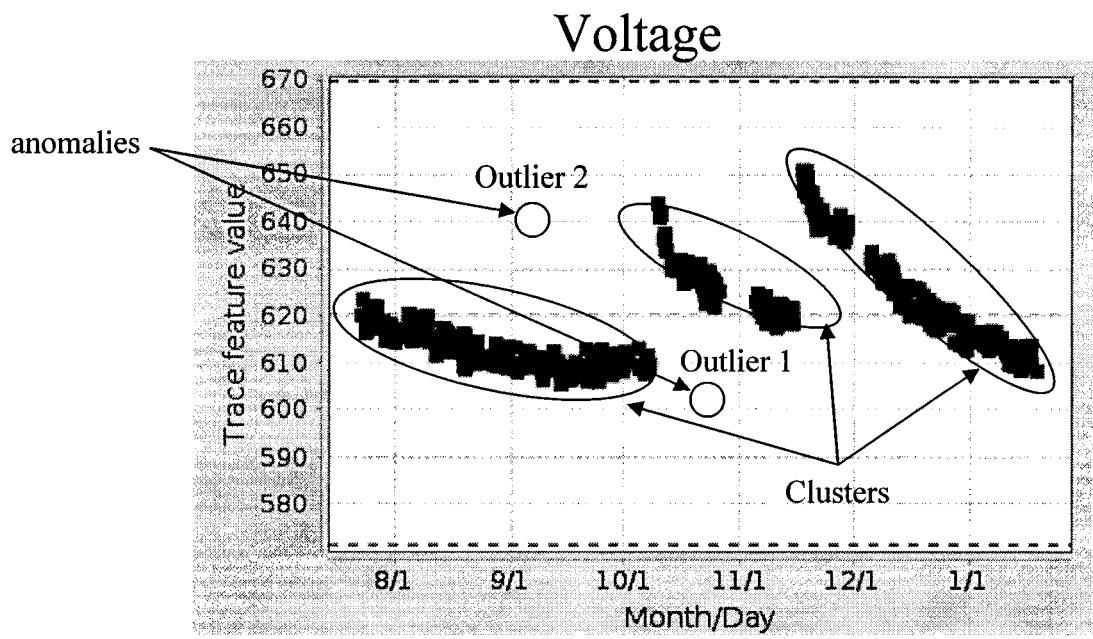
FIG. 10 is a diagram illustrating clusters and outliers determined by a sparse Gaussian mixture model according to an embodiment of the present invention.
Figure 11:
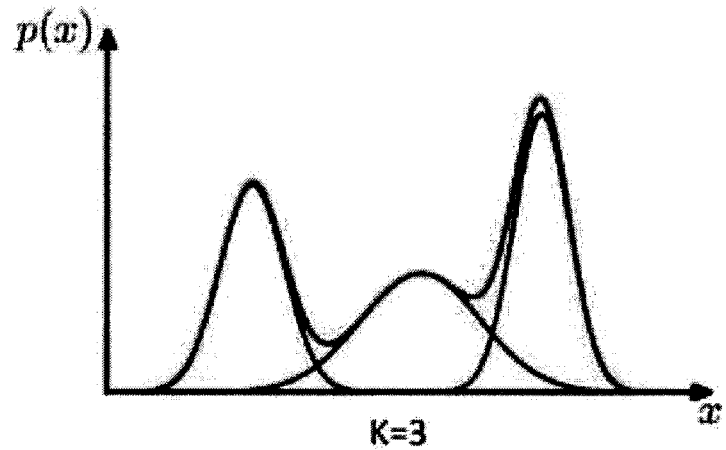
FIG. 11 is a diagram illustrating the Gaussian mixture model having been parameterized according to an embodiment of the present invention.
Figure 12:
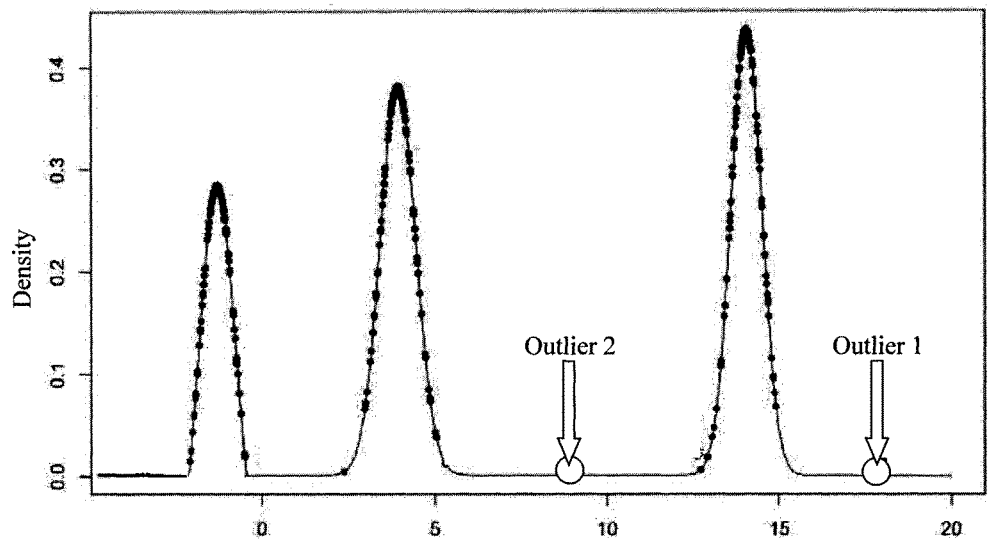
FIG. 12 is a diagram illustrating that high anomaly scores are related to the outliers according to an embodiment of the present invention.

As provided above, according to an exemplary embodiment, the prediction model is a two-layer sparse Gaussian mixture model. This model needs to automatically capture multiple operational states, respect temporal order of observations, and be robust to noise. A non-limiting example for using a multi-layer sparse Gaussian mixture model for anomaly detection (in this case from a time series of voltage data from the tool) is now described by way of reference to FIGS. 10-12. First, the density function of the multivariate sensor data (in this case voltage sensor data) is learned using the multi-layer sparse Gaussian mixture model whereby the model automatically determines a number of clusters. See FIG. 10. As shown in FIG. 10, there are anomalous trace feature values, i.e., outliers from the clusters. The Gaussian mixture model is parameterized with a set of (precision matrix, mean, mixture weight). See FIG. 11. Next, a score of the outliers is computed as the negative log of the probabilities to identify the anomalies. As shown in FIG. 12, the low-density values (which have high negative logs relative to all sample points in the data set) are related to the outliers/anomalies.

Figure 13:
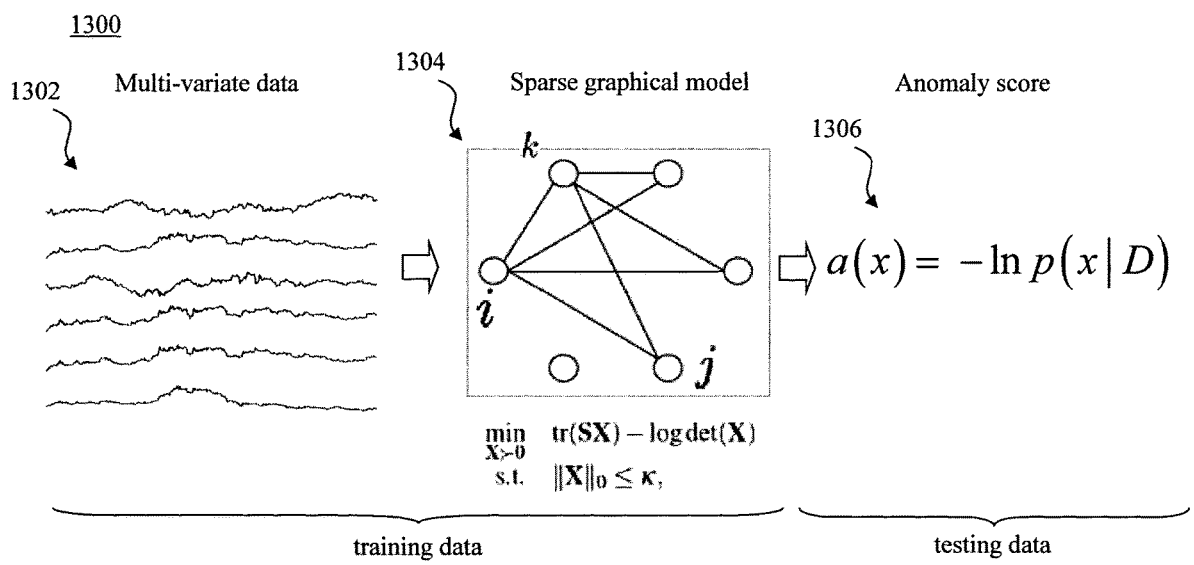
FIG. 13 is a diagram illustrating an exemplary methodology for using a sparse Gaussian graphical model-based anomaly detection approach as the basic building block of the prediction model according to an embodiment of the present invention.

According to an exemplary embodiment, a sparse Gaussian graphical model-based anomaly detection approach is used as the basic building block of the prediction model. See, for example, methodology 1300 of FIG. 13. In step 1302, multivariate historical input (e.g., voltage, current and/or pressure) sensor data is obtained for a given step. In step 1304, the multivariate historical input sensor data is used to train a sparse graphical model. Once trained, the sparse graphical model is used in step 1306 to calculate an anomaly score for the step using (e.g., voltage, current and/or pressure) sensor testing data.

Figure 14:
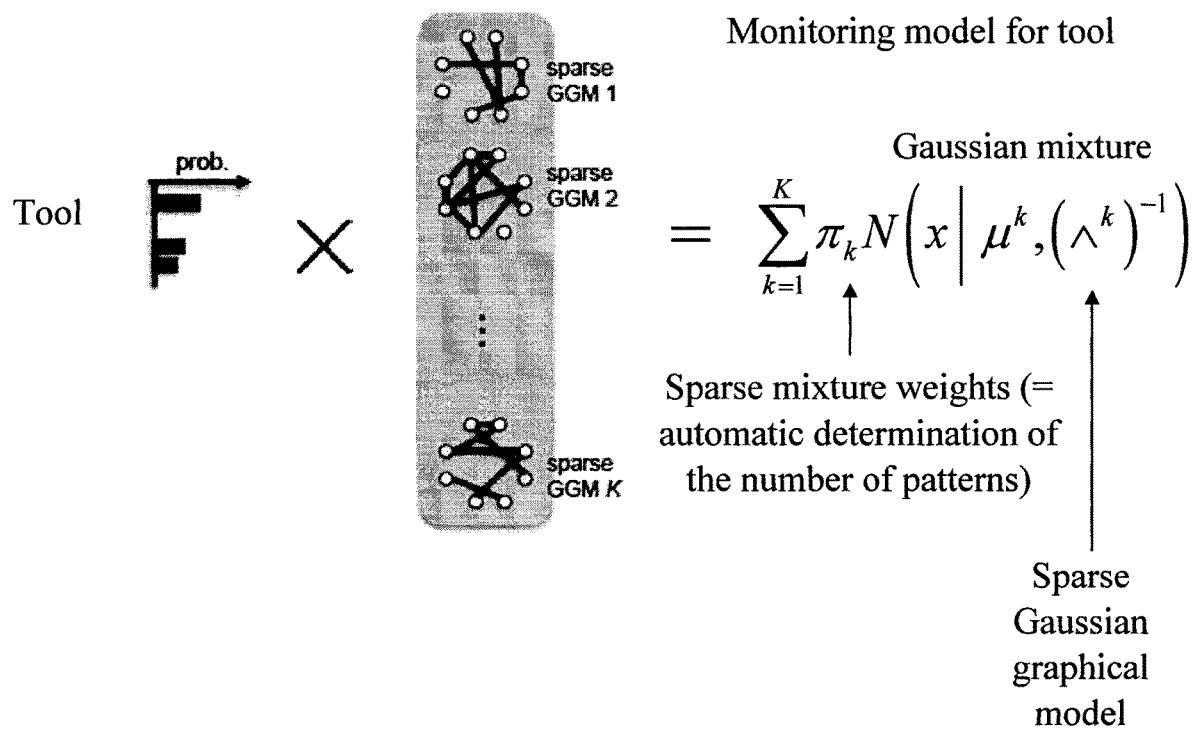
FIG. 14 is a diagram illustrating a multi-layer sparse mixture of sparse Gaussian graphical models being used as the prediction model according to an embodiment of the present invention.

A multi-layer sparse mixture of the sparse Gaussian graphical models for each step is then used as the prediction model (i.e., a sparse Gaussian mixture model). See FIG. 14. As shown schematically in FIG. 14, historical data from the tool under control is used to train a sparse Gaussian graphical model (i.e., GGM 1, GGM 2, ..., GGM K) for each step of the manufacturing process. The multi-layer sparse Gaussian mixture of these GGMs is then used as a monitoring model for the tool under control.

As highlighted above, two-layer Gaussian mixture model learning is employed whereby an anomaly score is learned for each step of the manufacturing process individually, and the multiple anomaly scores from each step are used to produce a final anomaly score. See, for example, FIG. 15. As shown in FIG. 15, the Gaussian mixture model (GMM) is first used to learn the anomaly score for each step of the manufacturing process individually (Layer 1). The individual anomaly scores then become the feature function for computing a final anomaly score (layer 2).

As provided above, a goal of the present techniques is to detect anomalies and recommend remedial actions accordingly. An exemplary remedial action recommendation system is now described. For instance, as described in detail above, given a dataset D, a predictive model f(x) is built to compute an anomaly score for any test instance $\bar{x}$. The model f(x) can be general such as a density-based model f(x)=−p (x|D), a graph-based model (i.e., GGM model), dimension embedding (i.e., PCA, autoencoder) and statistics (i.e., $T^2$ Hotelling). For instance, suppose that the sample $\bar{x}$ is anomalous, that is, the value f($\bar{x}$) is high (see, e.g., FIG. 12—described above), and significantly exceeds a pre-defined score threshold t:f($\bar{x}$)≫t. For example, for t=0.7, the range of score is [0,1].

It is assumed that the process includes a set C of controllable variables (such as voltage, current and/or pressure) and a set U of uncontrollable variables (such as the flow rate of reactive gases, raw materials, etc.), wherein $l_i$ is a lower limit for adjusting $x_i$, i∈C, and $u_i$ is an upper limit for adjusting $x_i$, i∈C. By way of example only, according to an exemplary embodiment, the lower/upper limit is set by the flow rate of reactive gases. The goal is to minimally modify some values of $\bar{x}$ in a pre-specified set of controllable variables C (such as voltage, current and/or pressure) within their specified (lower/upper) limits so that it brings the sample back to a regular/non-anomalous state. That is, the goal is to find $\hat{x}$ such that f($\hat{x}$)≤t and $\hat{x}$ does not deviate too far from $\bar{x}$, for example $\hat{x}$ should not be outside the range [$\bar{x}$-50% of |$\bar{x}$|, $\bar{x}$+50% of |$\bar{x}$|]. The number of adjustments is also minimal. The following is then solved to identify remedial action requirements:

$$\min_{x,y} \sum_{i \in C} |x_i - \bar{x}_i| + \alpha y$$

$$\text{subject to } f(x) \le t + y$$

$$\bar{x}_i - l_i \le x_i \le \bar{x}_i + u_i, i \in C$$

$$x_i = \bar{x}_i, i \in U$$

$$y \ge 0$$

$$x \in \mathbb{R}^n, y \in \mathbb{R},$$

wherein y is the tolerance for anomaly violation. When y=0, it means that the control variables can be adjusted to make the system regular. In some cases, there are no changes that can bring the system back to regular, and a new operating point is found with a minimal anomaly violation, e.g., it is measured by y.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Turning now to FIG. 16, a block diagram is shown of an apparatus 1600 for implementing one or more of the methodologies presented herein. By way of example only, system 200 of FIG. 2 can be embodied in apparatus 1600 which can be part of the manufacturing tool under control, and apparatus 1600 can be configured to perform one or more steps of methodology 400 of FIG. 4, one or more steps of methodology 500 of FIG. 5, one or more steps of methodology 1300 of FIG. 13, etc.

Apparatus 1600 includes a computer system 1610 and removable media 1650. Computer system 1610 includes a processor device 1620, a network interface 1625, a memory 1630, a media interface 1635 and an optional display 1640. Network interface 1625 allows computer system 1610 to connect to a network, while media interface 1635 allows computer system 1610 to interact with media, such as a hard drive or removable media 1650.

Processor device 1620 can be configured to implement the methods, steps, and functions disclosed herein. The memory 1630 could be distributed or local and the processor device 1620 could be distributed or singular. The memory 1630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1620. With this definition, information on a network, accessible through network interface 1625, is still within memory 1630 because the processor device 1620 can retrieve the information from the network. It should be noted that each distributed processor that makes up processor device 1620 generally contains its own addressable memory space. It should also be noted that some or all of computer system 1610 can be incorporated into an application-specific or general-use integrated circuit.

Optional display 1640 is any type of display suitable for interacting with a human user of apparatus 1600. Generally, display 1640 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for quality and yield improvement via anomaly detection, the method comprising:

collecting time series sensor data during individual steps of a semiconductor manufacturing process being performed using a semiconductor fabrication tool;

calculating anomaly scores for each of the individual steps using a predictive model; and implementing changes to the semiconductor manufacturing process by automatically adjusting the semiconductor fabrication tool for one or more of the individual steps that, based on the anomaly scores, are anomalous, wherein the semiconductor fabrication tool has multiple processing chambers for performing each of the individual steps of the semiconductor manufacturing process, wherein the anomaly scores for at least one of the individual steps performed in at least one of the processing chambers exceed a pre-determined threshold value, and wherein the method further comprises:

recommending remedial actions for the individual steps having the anomaly scores that exceed the pre-determined threshold value; and implementing the remedial actions in the semiconductor fabrication tool.

2. The method of claim 1, wherein the time series sensor data is selected from the group consisting of: voltage, current, pressure, position, flow, power, temperature, state, speed, time, duration, bias, frequency, setpoint, count, velocity, intensity, phase, cycle, in-use time, in-use cycles impedance sensor data, and combinations thereof.

3. The method of claim 1, wherein implementing the remedial actions in the semiconductor fabrication tool comprises:

automatically adjusting at least one parameter of the processing chambers in which the individual steps having the anomaly scores that exceed the pre-determined threshold value are performed based on the remedial actions recommended.

4. The method of claim 3, wherein the at least one parameter is selected from the group consisting of: voltage, current, pressure, position, flow, power, temperature, state, speed, time, duration, bias, frequency, setpoint, count, velocity, intensity, phase, cycle, in-use time, in-use cycles, impedance, and combinations thereof.

5. The method of claim 1, wherein the recommending comprises:

obtaining engineering domain knowledge.

6. The method of claim 1, further comprising:

tallying the anomaly scores for the wafers over the individual steps.

7. The method of claim 1, further comprising:

training the predictive model using historical time series sensor data.

8. The method of claim 7, wherein the historical time series sensor data is multi-dimensional, and wherein the training comprises:

processing the historical input data using one or more of principal component analysis (PCA), a gaussian random process (GRP), and an autoencoder to provide a compressed data representation;

calculating the anomaly scores for each of the individual steps using the predictive model and the compressed data representation; and determining remedial actions if the anomaly scores exceed a pre-determined threshold value.

9. The method of claim 8, wherein the historical time series sensor data is selected from the group consisting of: voltage, current, pressure, position, flow, power, temperature, state, speed, time, duration, bias, frequency, setpoint, count, velocity, intensity, phase, cycle, in-use time, in-use cycles impedance sensor data, and combinations thereof.

10. The method of claim 1, wherein the predictive model comprises a two-layer sparse Gaussian mixture model.

11. A computer program product for quality and yield improvement via anomaly detection, the computer program product comprising a computer readable storage medium having program instructions embodied therewith, the program instructions executable by a computer to cause the computer to:

collect time series sensor data during individual steps of a semiconductor manufacturing process being performed using a semiconductor fabrication tool;

calculate anomaly scores for each of the individual steps using a predictive model, wherein the predictive model comprises a two-layer sparse Gaussian mixture model; and implement changes to the semiconductor manufacturing process by automatically adjusting the semiconductor fabrication tool for one or more of the individual steps that, based on the anomaly scores, are anomalous, wherein the semiconductor fabrication tool has multiple processing chambers for performing each of the individual steps of the semiconductor manufacturing process, wherein the anomaly scores for at least one of the individual steps performed in at least one of the processing chambers exceed a pre-determined threshold value, and wherein the program instructions further cause the computer to:

recommend remedial actions for the individual steps having the anomaly scores that exceed the pre-determined threshold value; and implement the remedial actions in the semiconductor fabrication tool by automatically adjusting at least one parameter of the processing chambers in which the individual steps having the anomaly scores that exceed the pre-determined threshold value are performed based on the remedial actions recommended.

12. The computer program product of claim 11, wherein the program instructions further cause the computer to:

train the predictive model using historical time series sensor data.

13. The computer program product of claim 12, wherein the historical time series sensor data is multi-dimensional, and wherein the program instructions when training the predictive model further cause the computer to:

process the historical input data using one or more of PCA, a GPR process, and an autoencoder to provide a compressed data representation;

calculate the anomaly scores for each of the individual steps using the predictive model and the compressed data representation; and determine remedial actions if the anomaly scores exceed a pre-determined threshold value.

14. A system for quality and yield improvement via anomaly detection, comprising:

a sensor network for collecting time series sensor data during individual steps of a semiconductor manufacturing process being performed using a semiconductor fabrication tool;

an anomaly score calculator for calculating anomaly scores for each of the individual steps using a predictive model, wherein the predictive model comprises a two-layer sparse Gaussian mixture model; and a process operations update module for implementing changes to the semiconductor manufacturing process by automatically adjusting the semiconductor fabrication tool for one or more of the individual steps that, based on the anomaly scores, are anomalous, wherein the semiconductor fabrication tool has multiple processing chambers for performing each of the individual steps of the semiconductor manufacturing process, wherein the anomaly scores for at least one of the individual steps performed in at least one of the processing chambers exceed a threshold value, and wherein the process operations update module recommends remedial actions for the individual steps having the anomaly scores that exceed the pre-determined threshold value which are implemented in the semiconductor fabrication tool by automatically adjusting at least one parameter of the processing chambers in which the individual steps having the anomaly scores that exceed the pre-determined threshold value are performed based on the remedial actions recommended.

15. The system of claim 14, further comprising:

a model builder for training the predictive model using historical time series sensor data.

* * * * *